United States Patent [19]

Hernandez

[11] Patent Number: 4,989,117
[45] Date of Patent: Jan. 29, 1991

[54] MOLDED INTEGRATED CIRCUIT PACKAGE INCORPORATING THIN DECOUPLING CAPACITOR

[75] Inventor: Jorge M. Hernandez, Mesa, Ariz.
[73] Assignee: Rogers Corporation, Rogers, Conn.
[21] Appl. No.: 479,071
[22] Filed: Feb. 12, 1990
[51] Int. Cl.$^5$ .................. H01G 1/14; H05K 7/02; H01L 23/02
[52] U.S. Cl. ..................... 361/306; 357/74; 361/386
[58] Field of Search ............... 361/306, 321, 386; 29/25.42; 357/74; 174/72, 52 FP

[56] References Cited

U.S. PATENT DOCUMENTS

| | | | |
|---|---|---|---|
| 4,288,841 | 9/1981 | Gogal | 357/74 X |
| 4,734,819 | 3/1988 | Hernandez et al. | 361/306 |
| 4,750,092 | 6/1988 | Werther | 361/386 X |

Primary Examiner—Donald A. Griffin
Attorney, Agent, or Firm—Fishman, Dionne & Cantor

[57] ABSTRACT

A decoupling scheme which is particularly well suited for use with molded integrated circuit packages incorporating lead frames is presented. In accordance with the present invention, a thin decoupling capacitor is used which is comprised of a ceramic or like substrate having printed or otherwise applied thereon conductive layers, dielectric layers (e.g., glass/ceramic dielectric paste or dielectric sol-gel) and protective layers. Mounted on this thin capacitor is an integrated circuit chip. This thin capacitor/IC chip assembly is attached directly to the IC lead frame and thereafter encapsulated within the molded package resulting in a decoupling scheme which is internal to the molded IC package. Printed conductors on the thin capacitor's ceramic substrate are attached to appropriate fingers of the lead frame by welding, soldering or the like to effect strong mechanical and electrical contact.

16 Claims, 6 Drawing Sheets

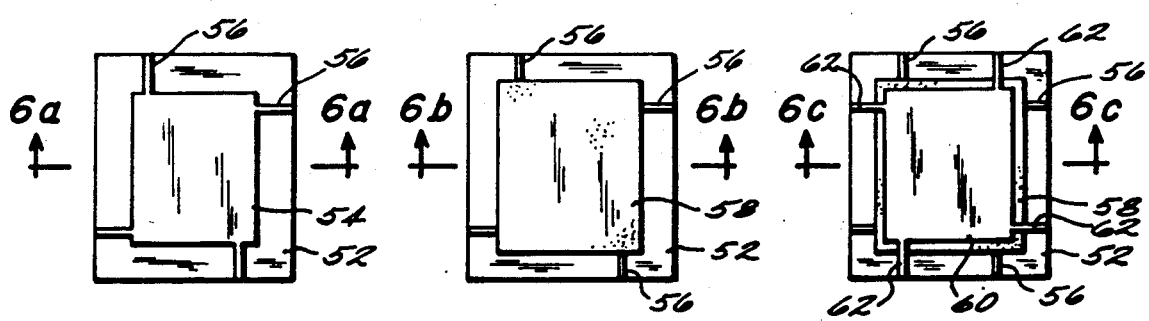
FIG. 5a  FIG. 5b  FIG. 5c
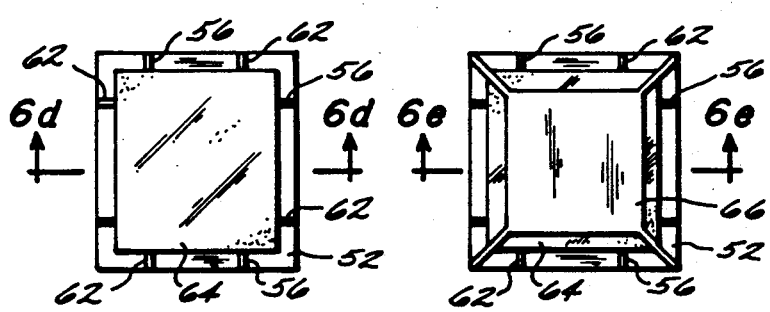
FIG. 5d  FIG. 5e
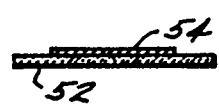 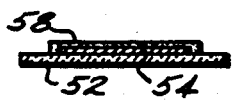 
FIG. 6a  FIG. 6b  FIG. 6c
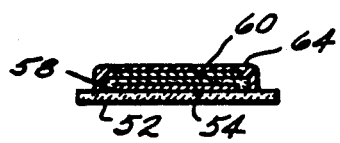 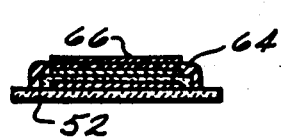 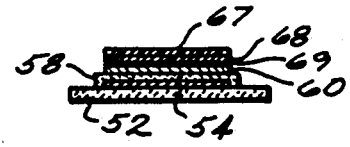
FIG. 6d  FIG. 6e  FIG. 7

MOLDED INTEGRATED CIRCUIT PACKAGE INCORPORATING THIN DECOUPLING CAPACITOR

BACKGROUND OF THE INVENTION

This invention relates to the field of integrated circuits packaged in a molded housing. More particularly, this invention relates to a method of suppressing noise (e.g. decoupling) from the voltage to ground distribution circuit in integrated circuit packages such as surface mounted leaded or leadless chip carriers, dual-in-line packages, and quad flat packages.

This application is related to U.S. application Ser. No. 479,075 entitled MOLDED INTEGRATED CIRCUIT PACKAGE INCORPORATING DECOUPLING CAPACITOR invented by Jorge Hernandez, U.S. application Ser. No. 479,095 entitled THIN CAPACITOR FOR MOUNTING UNDER INTEGRATED CIRCUIT PACKAGE invented by Jorge Hernandez and A. B. Feinberg, and U.S. application Ser. No. 479,094 entitled INTEGRATED CIRCUIT PACKAGE HAVING AN INTERNAL CAVITY FOR INCORPORATING DECOUPLING CAPACITOR invented by Jorge Hernandez, all of which have been filed contemporaneously with this application.

It is well known in the field of microelectronics that high frequency operation, particularly the switching of integrated circuits, can result in transient energy being coupled into the power supply circuit. It is also well known that integrated circuits are becoming more dense (more gates per unit area of silicon/or gallium arsenide), more powerful (more watts per unit area of IC chip), and faster with higher clock rate frequencies and with smaller rise times. All of these recent developments make the problem of suppressing noise in the power bus (produced by a large amount of simultaneous gates switching) even more serious than in the past.

Generally, the prevention of the coupling of undesired high frequency noise or interference into the power supply for an integrated circuit is accomplished by connecting a decoupling capacitor between the power and the ground leads of the IC. Conventional methods of decoupling (noise suppression) include the use of decoupling capacitors external to the IC package, such as monolithic multilayer ceramic chip capacitors. One external connection scheme of this type which has been found to be quite successful is to mount a decoupling capacitor underneath an integrated circuit. Such decoupling capacitors are commercially available from Rogers Corporation (assignee of the present application) and are sold under the trademark MICRO Q. Examples of these decoupling capacitors are found in U.S. Pat. Nos. 4,475,143, 4,502,101 and 4,748,537, all of which are assigned to the assignee hereof. U.S. Pat. Nos. 4,626,958, 4,667,267, 4,658,327, 4,734,818, 4,734,819 and 4,853,826 are also assigned to the assignee hereof. These patents disclose decoupling capacitors which are particularly well suited for pin grid array and plastic leaded chip carrier packages.

Still other decoupling connection schemes are known. For example, multilayer capacitor (MLC) chips have been placed on top of PGA ceramic IC packages with interconnections built in from the surface of the PGA package down to the proper places in the internal circuitry of the package. In still some other cases, schemes have been devised to incorporate a MLC chip into a specially configured IC lead frame, but due to production difficulties, this approach has not become widely accepted. Attempts have also been made to build a capacitive layer into a PGA ceramic package (and into a leadless ceramic chip carrier), by using thin layers of alumina or other adequate ceramic dielectric material. Again, this approach has not found wide acceptance.

For a number of years, the users of integrated circuits have been aware of the need to reduce the inductance of the decoupling loop, so that switching noise can be minimized. The best way to accomplish this is by placing the decoupling capacitor as close to the IC chip (silicon or gallium arsenide) as possible. Ideally, the decoupling capacitor should be built in with the IC itself. However, due to materials and processing incompatabilities, this is not possible at the present time.

Accordingly, there continues to be a need for improved connection schemes for decoupling undesired high frequency noise from integrated circuits wherein the inductance within the decoupling loop is reduced to as low a level as possible. A recent attempt at providing an improved connection scheme is disclosed in my aforementioned U.S. application Ser. No. 479,075 entitled "Molded Integrated Circuit Package Incorporating Decoupling Capacitor". In accordance with this co-pending application, a parallel plate-type decoupling capacitor is attached directly to the IC lead frame and thereafter encapsulated within the molded package along with the IC chip resulting in a decoupling scheme which is internal to the molded IC package. The capacitor preferably comprises a thin layer of ceramic dielectric sandwiched between top and bottom conductors. The top conductor may be attached to the die bar of the lead frame using an electrically conductive or non-conductive adhesive. Leads extending from the capacitors are attached to appropriate fingers of the lead frame by welding, soldering or the like to effect strong mechanical and electrical contact. While this decoupling scheme provides many features and advantages relative to prior art decoupling schemes it still nevertheless exhibits a level of inductance which may be undesirable for certain very dense, high speed IC chips.

SUMMARY OF THE INVENTION

The above-discussed and other problems and deficiencies of the prior art are overcome or alleviated by the decoupling scheme of the present invention which is particularly well suited for use with molded integrated circuit packages incorporating lead frames. In accordance with the present invention, a thin decoupling capacitor is used which is comprised of a ceramic or like substrate having printed or otherwise applied thereon conductive layers, dielectric layers (e.g., glass/ceramic dielectric paste or dielectric sol-gel) and protective layers. Mounted on this thin capacitor is an integrated circuit chip. This thin capacitor assembly is attached directly to the IC lead frame and thereafter, the IC chip is attached, wire bonded and encapsulated within the molded package resulting in a decoupling scheme which is internal to the molded IC package. Printed conductors on the thin capacitor's ceramic substrate are attached to appropriate fingers of the lead frame by welding, soldering or the like to effect strong mechanical and electrical contact.

The decoupling scheme of the present invention provides many features and advantages relative to prior art decoupling schemes. For example, the very thin dielectric layer (e.g., about 0.001 inch or less) of the thin capacitor reduces the inductance of the decoupling capacitor, reduces the inductance of the decoupling loop and enhances the effectiveness of the decoupling capacitor to suppress high frequency noise. Also, the decoupling capacitor may be attached to the lead frame without interferring with existing automatic IC assembly processes such as die attachment, wire bonding and encapsulation by transfer molding. Still another important feature of this invention is an improvement in heat transfer from the IC chip out of the molded package. Presently, heat is conducted out of the package primarily through the molding compound from the silicon chip. By attaching the thin decoupling capacitor to the lead frame, an improvement in heat conduction results in that the capacitor acts as a heat spreader, diffusing the IC heat onto the molding compound through a larger area than that of the IC chip support platform, therefore improving the heat removal rate.

The above discussed and other features and advantages of the present invention will be appreciated and understood by those of ordinary skill in the art from the following detailed description and drawings.

BRIEF DESCRIPTION OF THE DRAWINGS

Referring now to the drawings wherein like elements are numbered alike in the several Figures:

FIGS. 5A-5E are top plan views of a method of manufacturing the capacitor of FIG. 4;

FIGS. 6A-6E are cross-sectional elevation views along the lines 5A—5A through 5E-5E, respectively, depicted in FIGS. 5A-5E;

FIG. 7 is a cross sectional elevation view through a second embodiment of a thin capacitor in accordance with the present invention;

DESCRIPTION OF THE PREFERRED EMBODIMENT

In accordance with the present invention, a thin decoupling capacitor is electrically connected to an integrated circuit chip internally within a molded IC package. This electrical connection is accomplished by attaching a thin decoupling capacitor to the lead frame of the IC package and then making appropriate connections between the decoupling capacitor and the fingers of the lead frame. The present invention is well suited for use with any type of molded IC package including, but not limited to plastic leaded or leadless chip carriers, dual-in-line packages, or quad flat Packs. For purposes of illustration only, the following description of the present invention will be with regard to a lead frame for use in a plastic leaded chip carrier (PLCC) package. However, as already mentioned, the present invention is equally useful for any other type of molded package which utilizes lead frames.

Figure 1:
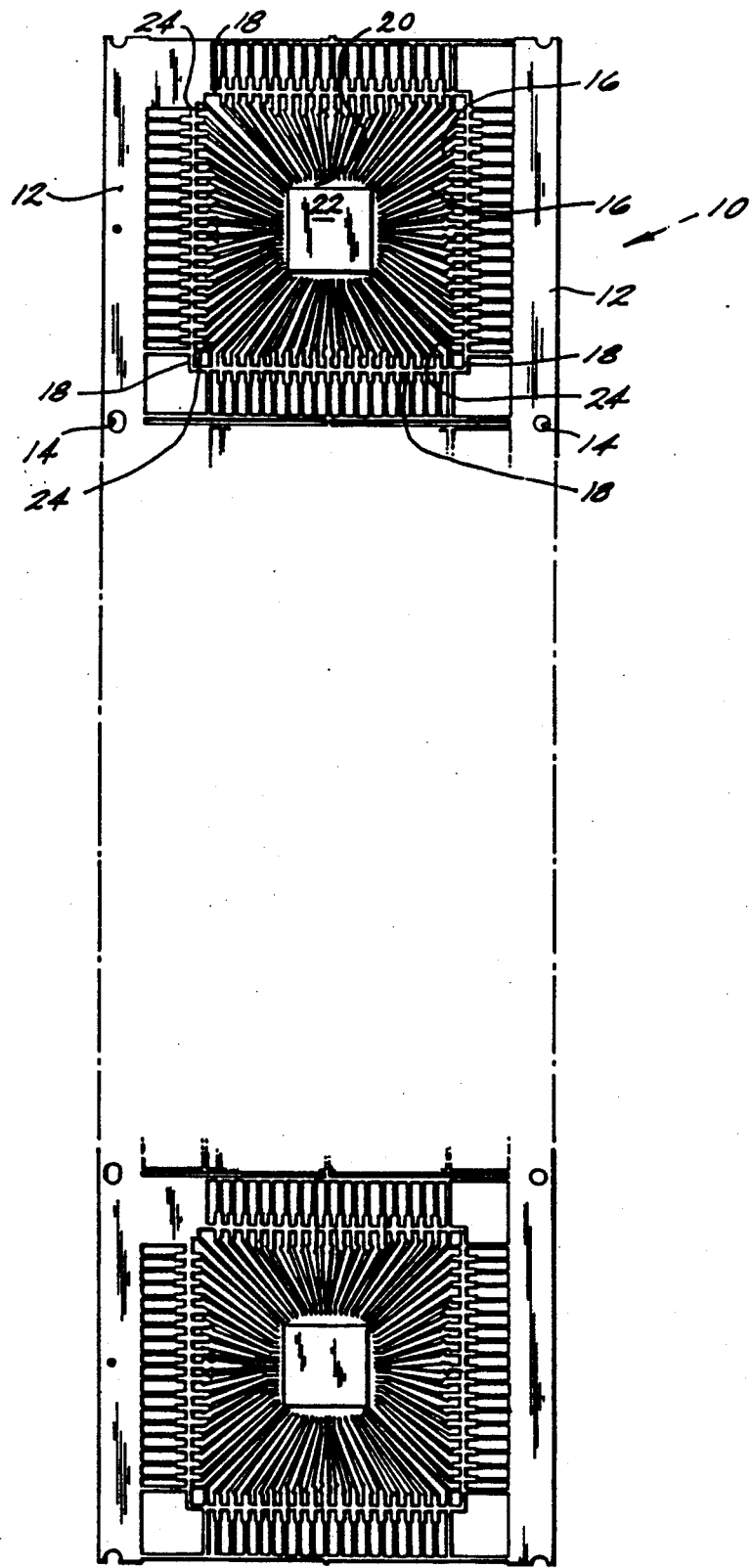
FIG. 1 is a plan view of a known lead frame in accordance with the prior art.

Turning now to FIG. 1, a lead frame strip is shown generally at 10. Such lead frame strips are well known in the art and comprise a plurality of adjacent lead frames interconnected between a pair of carrier supports 12 which incorporate registration holes 14. Each lead frame is made from thin stamped metal and includes a plurality of leads or fingers 16 which are supported on one end by a dam bar 18 and are unsupported on their opposite ends. All of the fingers 16 terminate at a space 20 which has a generally square shape. Within space 20 is a die support platform 22 which is supported on its four corners by four die bars 24 which in turn are connected to dam bars 18.

As is well known in the art, during production of IC packages, an integrated circuit chip or die is positioned on the die support platform 22. Next, the IC chip is electrically connected to each individual finger 16 by use of die wire bonding in a well known fashion. Thereafter, the IC chip and lead frame is encapsulated in a molded package with the ends of the fingers 16 adjacent the dam bar 18 being excised prior to the dam bar to provide a discrete integrated circuit chip package. It will be appreciated that no electrical circuitry (wire bonding) is connected between the integrated circuit chip and the die bars 24 so that the die bars are electrically inactive.

Figure 2:
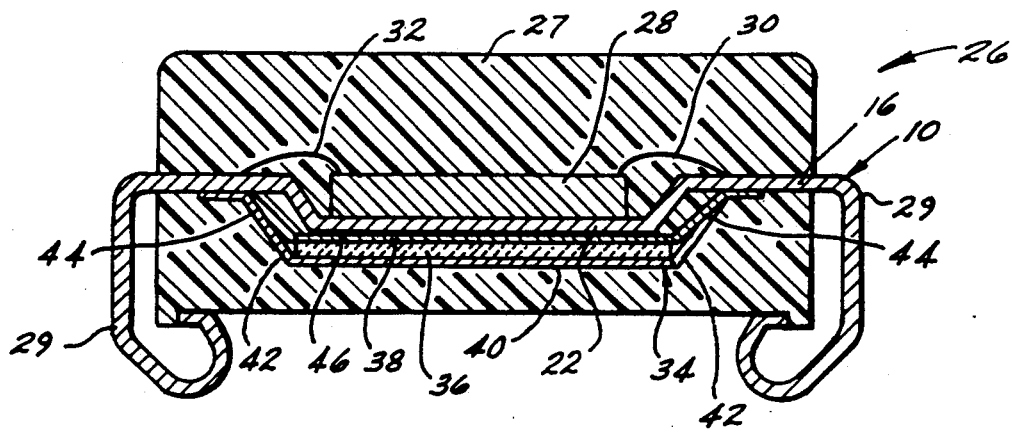
FIG. 2 is a cross sectional elevation view through a molded integrated circuit chip package in accordance with U.S. application Ser. No. 479,075 filed Feb. 12, 1990.

Turning now to FIG. 2, a molded integrated circuit chip carrier package in accordance with my copending U.S. application Ser. No. 479,075 is shown generally at 26. Package 26 includes a lead frame 10 wherein the die support platform 22 supports an integrated circuit chip 28 which has been wire bonded via wire bonds 30 and 32 to the fingers 16 of lead frame 10. The lead frame 10 and IC chip 28 has been encapsulated in a molded package 27. The ends of each finger 16 adjacent the dam bar have been excised and the leads bent so as to form J-leads 29. Of course, any other lead configuration may be used.

In accordance with my copending invention, a thin parallel plate decoupling capacitor 34 is attached to the bottom surface of die support platform 22 which is opposite the surface thereof supporting integrated circuit chip 28. Decoupling capacitor 34 comprises a thin layer of dielectric material 36 which is preferably a ceramic. Dielectric layer 36 is sandwiched between an upper conductor 38 and a lower conductor 40. Each conductor 38 and 40 includes a plurality of leads 42 and 44, respectively, extending therefrom and bonded to selected fingers of the lead frame 16.

Figure 3:
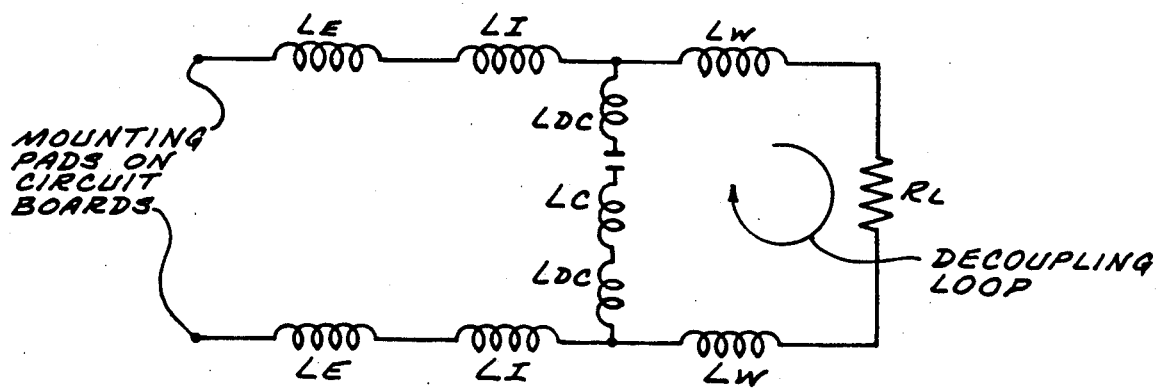
FIG. 3 is a circuit diagram of the IC package of FIG. 2.

While the internal decoupling scheme of FIG. 2 is superior to known external decoupling methods, this assembly nevertheless has a level of inductance which may be undesirably high. Referring to FIG. 3, a circuit diagram for the decoupling scheme of FIG. 2 is shown wherein:

$C$ = Capacitance of the decoupling capacitor $L_E$ = Inductance of the lead frame from the mounting pad to the lead ingress to the package;

$L_l$ = Inductance of the lead frame from the point of ingress of the lead, to the point of bonding of the bonding wire;

$L_w$ = Inductance of the bonding wire.

$R_L$ = Resistive load (represents energy consumption in the IC circuit); and $L_{DC}$ = Inductance of the parallel plate structure of the decoupling capacitor Ideally, the inductance of the decoupling loop should be zero. Clearly, this is physically impossible due to the inherent inductance of the bonding wires 32 and the inherent inductance of the decoupling capacitor 34. The inductance of the decoupling capacitor 34 is directly proportional to the length of its leads 42, 44, as well as to the spacing between the parallel plate electrodes 38, 40. The inductance is inversely proportional to the width of the leads 42, 44 and the number of them. The inductance also depends on the aspect ratio of the parallel plate electrodes 38, 40. A markedly rectangular shape is more inductive than a square.

Whereas little can be done to minimize the inductance of the bonding wires other than ribbon bonds (instead of wire bonds), or multiple wirebonds from the IC bonding pad to the lead frame, in accordance with an important feature of the present invention, the inductance of the decoupling capacitor can be reduced by use of a thin capacitor which avoids the high 10 inductance leaded structure of capacitor 34 and inherently will result in much lower inductance values.

Figure 4:
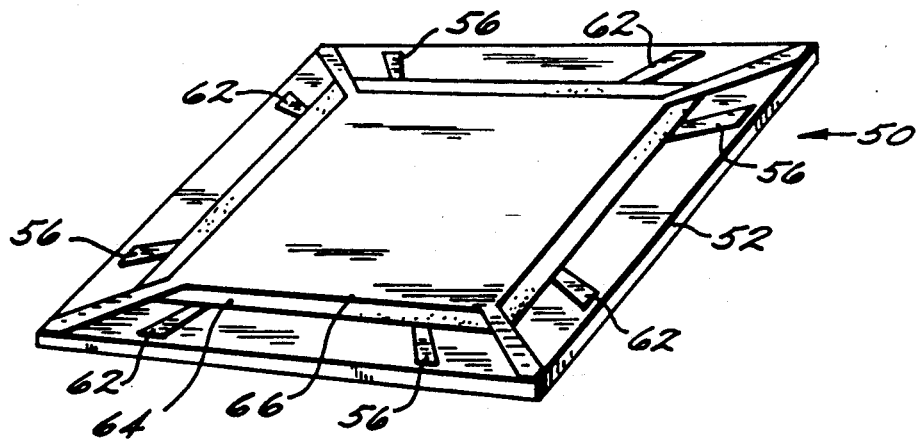
FIG. 4 is a perspective view of a thin capacitor for use in the present invention.
Figure 9:
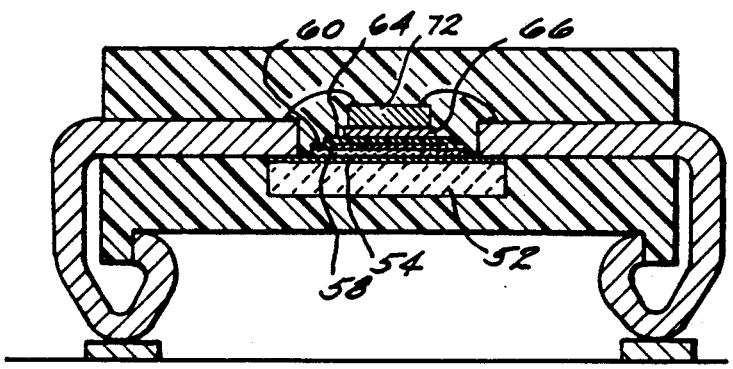
FIG. 9 is a cross sectional elevation view of a molded integrated circuit package in accordance with the present invention.

An example of a thin capacitor suitable for use in the present invention is shown generally at 50 in FIG. 4. Referring to FIGS. 5A-E and 6A-E, a method for making capacitor 50 is shown. Turning first to FIGS. 5A and 6A, capacitor 50 includes a relatively thick base or substrate 52 (e.g., 0.008" to 0.010" thick) which is preferably made of a ceramic material and includes a first (lower) electrode 54 printed thereon. A plurality of spaced conductive printed leads 56 (in the form of circuit traces) extend from electrode 54 toward the outer edges of substrate 52. Next, a thin layer of dielectric material 58 having a high dielectric constant is provided onto electrode 54 (FIGS. 5B and 6B). The second (upper) electrode 60 is then printed onto the upper surface of dielectric layer 58 along with a plurality of selected printed leads 62 (also in the form of circuit traces) which again extend toward the outer edges of substrate 52 (FIGS. 5C and 6C). A protective (electrically insulating) layer 64 is then applied over the second electrode 60 as shown in FIGS. 5D and 6D. Finally, the non-conductive insulating layer 64 has printed thereon an optional conductive layer 66 (e.g. conductive ink) to which will be mounted the integrated circuit chip as shown in FIG. 9. The total thickness of the capacitor is preferably less than or equal to about 0.0024 inch.

The ceramic substrate 52 can be made of alumina, aluminum nitride, beryllia or other similar material. Among the above mentioned, aluminum nitride and beryllia have the advantage of higher thermal conductivity than alumina (a high thermal conductivity is important for enhanced heat removal from the IC silicon, or gallium arsenide, chip).

In general, the capacitive element (made up of electrodes 54, 60 and dielectric layer 58) may be built up on ceramic substrate 12 using either thick film or thin film techniques. The thick film technique may utilize processes already well known in the art including screening, drying and firing. The thin film technology may employ any one of several different methods for coating of the dielectric and electrode layers. Among these techniques may be chemical vapor deposition (CVD), low temperature arc vapor deposition (LTAVD), spin-coating by a sol or sol-gel technology, sputtering or ion-plating. It will be readily apparent to those of ordinary skill in the art that some of those techniques may only be compatible for depositing either the dielectric or the electrode, while some may be utilized to produce both the dielectric and the electrode. A discussion will now be made in more detail of the preferred thick and thin film techniques employed for forming the capacitive element (items 54, 60 and 58).

The conductor layers 54, 60 may be either screen printed, vapor deposited or sputtered and can be made of silver palladium, gold, tungsten, molybdenum or other suitable base metal that will not oxidize at the sintering temperatures of the ceramic dielectric layer 58 and protective layer 64. The conductors are preferably silver/palladium thick film conductor compositions or other conductive metallizations made in the form of thick film inks; or any conductor deposited by a vacuum technology.

The dielectric layer 58 preferably comprises a printed layer of a glass ceramic high dielectric paste (having a DK of approximately 1750-3000), with a fixed thickness in the vicinity of 0.001". Examples of such pastes include barium titanate, lead magnesium niobate (with or without glass additions) or strontium titanate. Alternatively, dielectric layer 58 can be fabricated by a dielectric sol-gel, spin deposited on the electrode layer 54 and sintered at relatively low temperature (600°-800° C.). The dielectric sol-gel is preferably based on a barium titanate which is properly doped to achieve the desired temperature stability characteristic. One of the advantages of the latter sol-gel embodiment is that very thin dielectric films can be obtained (approximately 1 micron), so that a very high capacitance volumetric efficiency can be realized. Also, with a very thin dielectric layer, the inductance of the capacitor body itself is greatly reduced, thereby reducing the inductance of the decoupling loop and enhancing the effectiveness of the decoupling capacitor 50 to suppress high frequency noise.

If a sol-gel method is used to fabricate the dielectric layer 58, the surface of the first electrode layer should be polished to achieve a finish with features of less than 0.1 micron in size, to minimize the possibility of puncturing the dielectric layer.

The protective insulating layer 64 can be fabricated by printing and firing a ceramic paste (not necessarily having high dielectric constant) or a glass of the proper glazing temperature. The glass must be compatible (melting temperature) with the sintering temperature of the conductive ink in layer 66 if that is the process chosen to fabricate layer 66.

Conductive layer 66 can be fabricated by screen printing and firing an adequate conductive ink, such as silver palladium, gold, nickel, etc. Alternatively, layer 66 can be fabricated by metal vapor deposition or sputtering on the protective insulating layer 64. The thickness of the conductive layer 66 is important to remove heat from the IC silicon (or gallium arsenide) chip. If more thickness is required than is achieved by painting, sputtering or vapor disposition, an electroplating process can be used, with copper, gold or other suitable material.

Referring to FIG. 7, an alternative method of fabricating both the protective insulating layer 64 and the conductive area 66 is by bonding to the second electrode layer 60 a copper, nickel or the like clad polyimide or other suitable polymeric film material 68 wherein the conductive metal layer (e.g., copper) is identified at 67 and the non-conductive substrate (e.g., polyimide) is identified at 68. A suitable high temperature non-conductive adhesive 69 bonds polyimide layer 68 to the second electrode 60.

Figure 8:
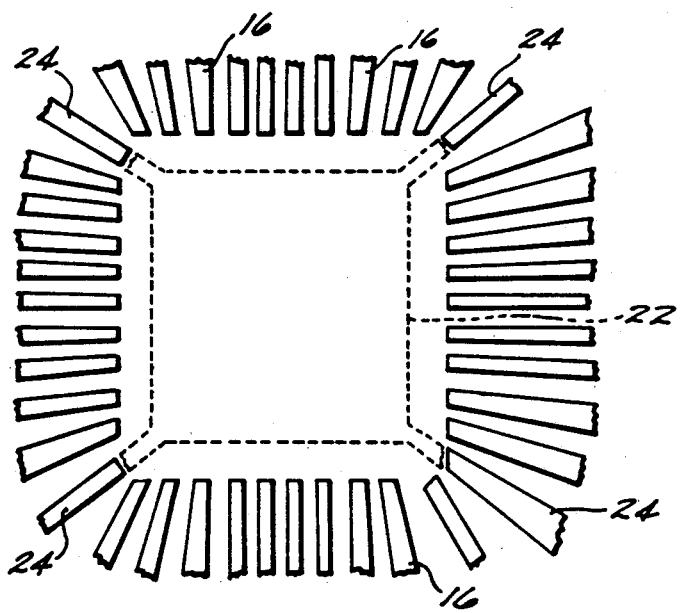
FIG. 8 is a top plan view of a portion of the lead frame of FIG. 1 with the IC chip support removed.

Depending on the fabrication method, the overall thickness of capacitor 50 can be as low as approximately 0.01_" to 0.012", which is an important feature since capacitor 50 will therefore not be obstrusive to the transfer molding encapsulation process used in molding the integrated circuit package. In order to utilize the thin capacitor 50 in the IC package of this invention, the lead frame 10 of FIG. 1 is modified by removing the die support platform 22 (typically by a stamping operation) as shown in FIG. 8. As a result, space 20 is left completely open.

Figure 10:
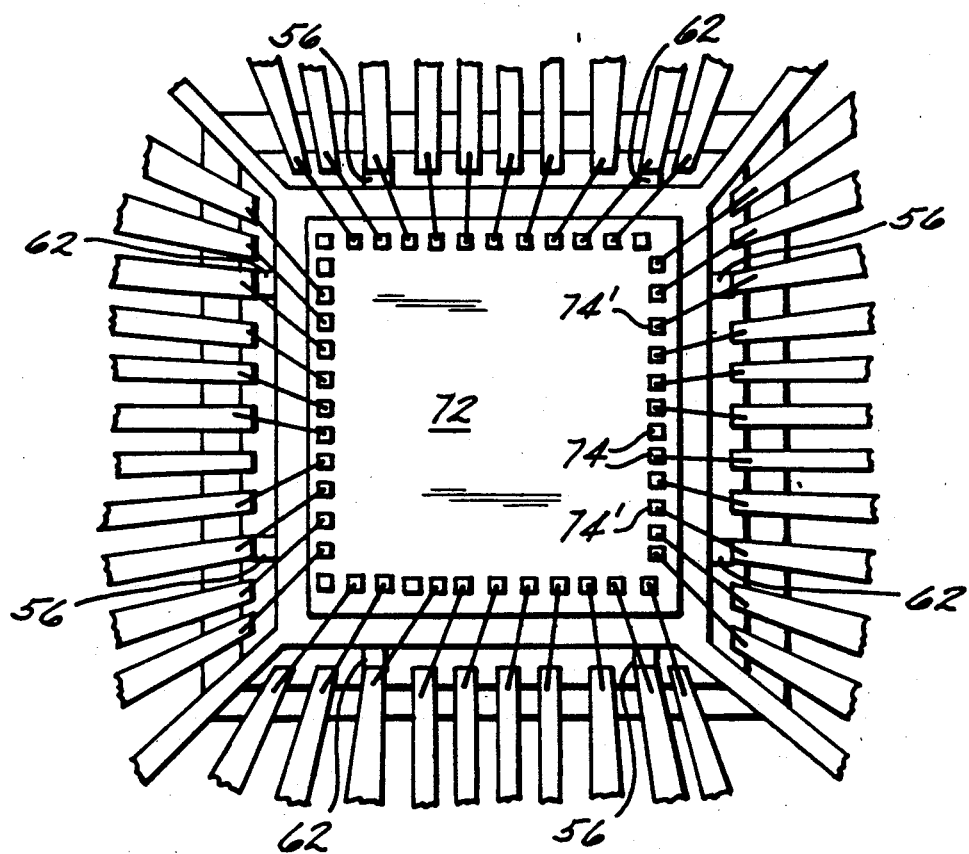
FIG. 10 is a plan view depicting the IC package of FIG. 9 with the molding material removed.
Figure 11:
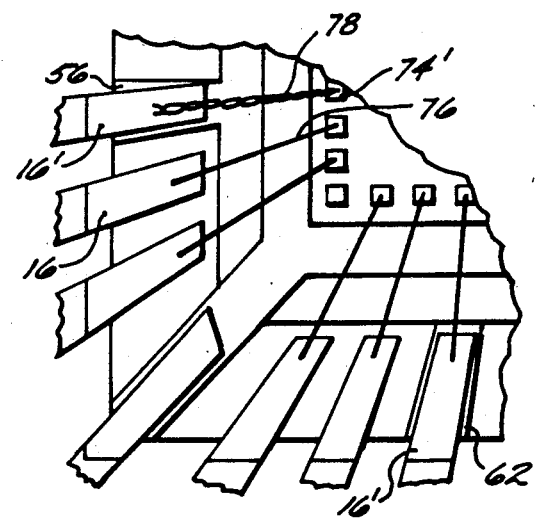
FIG. 11 is an enlarged top plan view of a portion of the IC package of FIG. 9 with the molding material removed.

Turning now to FIG. 9, a molded IC package is depicted which incorporates therein a thin capacitor 50. Referring simultaneously to FIGS. 9-11, the conductive layer 66 of decoupling capacitor 58 has mounted thereon an IC chip 72. Next, leads 56 and 62 from electrode layers 54 and 60, respectively, are attached (by brazing, welding, soldering or like technique) to corresponding voltage and ground lead frame fingers 16'. This is best shown in FIGS. 10 and 11. In turn, the IC voltage and ground bonding pads 74' are also connected to the voltage and ground lead frame fingers 16" using either wire bonding 76 or ribbon style wire bonding 78 for minimization of inductance.

Figure 9A:
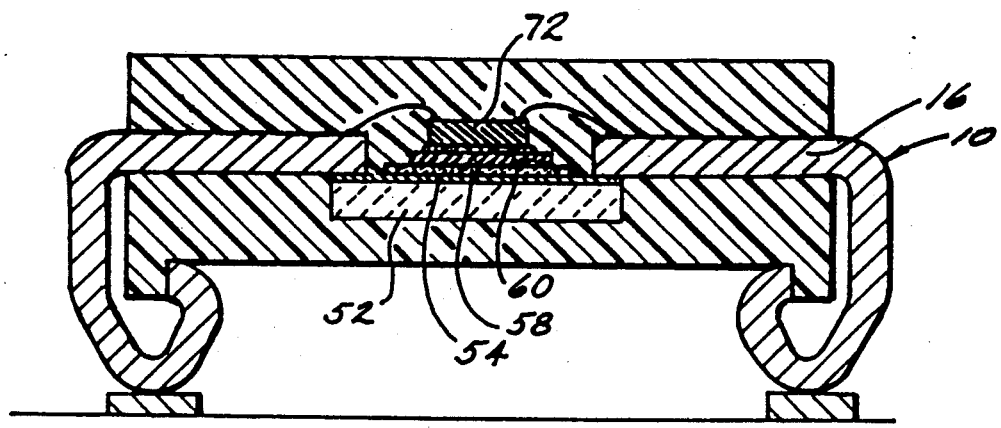
FIG. 9A is a cross-sectional elevation view of a molded integrated circuit package in accordance with another embodiment of this invention.

In some applications, the IC chip body is connected to ground potential. In this latter case, the top or upper electrode 60 would be connected directly to the IC chip body 72 using a suitable electrically conductive (and preferably also thermally conductive) adhesive 73 such as silver filled epoxy, polyimide or glass. The resultant thin capacitor would have the structure shown in FIGS. 5C and 6C with the electrical adhesive directly connecting electrode 60 to IC chip 72 as shown in FIG. 9A. It will be appreciated that leads 62 would not be necessary in this latter embodiment.

In comparing the IC package of FIG. 9 to the IC package of FIG. 2, it will be appreciated that the length and thickness of leads 56, 62 are much smaller than the length and thickness of leads 42, 44. Referring to FIG. 3, this smaller relative lead size results in a much smaller $L_{DC}$ for the FIG. 9 package as compared to the FIG. 2 package. Therefore, the inductance of the decoupling loop of FIG. 9 (for the same IC and an IC package of the same size) is much less than in FIG. 2.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A molded integrated circuit (IC) package comprising:
   lead frame means, said lead frame means including a plurality of conductive fingers arranged in a preselected pattern, said fingers each having a first end and a second end, said first ends of said fingers terminating at an inner space;
   a capacitor provided onto a non-conductive support substrate, said capacitor including leads in the form of circuit traces which extend outwardly therefrom and along a surface of said support substrate, said leads being electrically connected to selected fingers of said lead frame means;
   an integrated circuit chip on said capacitor, said integrated circuit chip being electrically connected to said first ends of said fingers; and
   molding material encapsulating said integrated circuit chip and capacitor and at least part of said lead frame means.

2. The IC package of claim 1 wherein said capacitor comprises:
   a pair of first and second electrodes sandwiching therebetween at least one layer of dielectric material with said leads extending from at least one of said first and second electrodes and with said first and second electrodes comprising a thin layer of deposited conductive material, said first electrode being deposited on said support substrate.

3. The IC package of claim 2 wherein:
   said electrodes are screen printed, vapor deposited or sputtered.

4. The IC package of claim 2 wherein:
   said capacitor has a thickness of less than or equal to 0.0024 inch.

5. The IC package of claim 2 including:
   a non-conductive protective insulating layer on said second electrode.

6. The IC package of claim 5 including:
   a conductive layer deposited on said protective insulating layer, said integrated circuit chip being positioned on said conductive layer.

7. The IC package of claim 2 wherein:
   said conductive layer is screen printed, vapor deposited, sputtered or electroplated.

8. The IC package of claim 2 including:
   a metal clad polymeric film, said film being bonded to said second electrode.

9. The IC package of claim 2 including:
   electrically conductive adhesive bonding said second electrode to said circuit chip.

10. The IC package of claim 9 wherein:
    said second electrode is free of leads extending therefrom.

11. The IC package of claim 2 including:
    leads extending from both of said first and second electrodes.

12. The IC package of claim 1 wherein:
    said dielectric layer comprises a thin deposited layer of ceramic paste or dielectric sol-gel.

13. The IC package of claim 12 wherein:
    said dielectric layer has a dielectric constant of between about 1750–3000.

14. The IC package of claim 12 wherein:
    said dielectric layer has a thickness of less than or equal to 0.001 inch.

15. The IC package of claim 1 wherein:
    said support substrate comprises a ceramic material.

16. The IC package of claim 15 wherein:
    said ceramic substrate has a thickness of about 0.008 to 0.010 inch.

* * * * *